United States Patent [19]

Lowis et al.

[11] 4,408,384
[45] Oct. 11, 1983

[54] METHOD OF MANUFACTURING AN INSULATED-GATE FIELD-EFFECT TRANSISTOR

[75] Inventors: Royce Lowis, Southampton; Peter M. Tunbridge, Winchester, both of England

[73] Assignee: U.S. Philips Corporation, New York, N.Y.

[21] Appl. No.: 407,673

[22] Filed: Aug. 12, 1982

Related U.S. Application Data

[63] Continuation of Ser. No. 141,518, Apr. 18, 1980, abandoned.

[30] Foreign Application Priority Data

May 2, 1979 [GB] United Kingdom ............... 7915232

[51] Int. Cl.³ .................... H01L 21/265; H01L 21/28
[52] U.S. Cl. ........................................ 29/571; 29/578; 29/580; 29/591; 29/576 B; 357/20; 357/23 D
[58] Field of Search ................. 29/571, 578, 580, 591, 29/576 B; 357/20, 23 VD

[56] References Cited

U.S. PATENT DOCUMENTS

| | | | |
|---|---|---|---|
| 3,969,745 | 7/1976 | Blocker | 357/22 |
| 4,003,126 | 1/1977 | Holmes et al. | 29/571 |
| 4,105,475 | 8/1978 | Jenne | 29/580 X |
| 4,175,317 | 11/1979 | Aoki et al. | 29/578 X |
| 4,181,542 | 1/1980 | Yoshida et al. | 29/571 |
| 4,194,283 | 3/1980 | Hoffmann | 29/571 |
| 4,198,693 | 4/1980 | Kuo | 29/571 X |
| 4,200,968 | 5/1980 | Schroeder | 29/571 |
| 4,227,297 | 10/1980 | Angerstein | 29/578 X |
| 4,369,564 | 1/1983 | Hiltpold | 29/591 X |

FOREIGN PATENT DOCUMENTS 1913053 12/1969 Fed. Rep. of Germany ........ 357/23

OTHER PUBLICATIONS

Morita et al., "Si UHF MOS High Power FET", *IEEE Transactions on Electron Devices*, Nov. 1974, pp. 733-734.

Primary Examiner—G. Ozaki
Attorney, Agent, or Firm—Jack Oisher; Robert T. Mayer; Steven R. Biren

[57] ABSTRACT

An insulated-gate field-effect transistor is disclosed which is particularly suitable for forming high-frequency transistors for a common source circuit configuration. The field-effect transistor is obtained in a simple and reliable manner using the following steps: (a) forming on an insulating layer a gate layer having separate, parallel apertures; (b) doping said epitaxial layer via said apertures so as to form parallel islands from which at least a portion of the source fingers is to be provided; (c) providing an etch-resistant mask having smaller parallel apertures each of which overlies an area of an island; (d) etching away said areas and underlying parts of the epitaxial layer so as to form parallel V-shaped grooves which expose the substrate, extend longitudinally along the islands and are adjoined along opposite sides by remaining parts of said islands, and (e) providing within the apertures of the gate layer and over the walls of the grooves parallel metal fingers which extend longitudinally along said islands to short-circuit the remaining parts of said islands to the epitaxial layer and to the substrate. These remaining parts form source fingers of the transistor. At least part of the drain fingers may also be formed in step (b).

8 Claims, 12 Drawing Figures

METHOD OF MANUFACTURING AN INSULATED-GATE FIELD-EFFECT TRANSISTOR

This is a continuation of application Ser. No. 141,518, filed Apr. 18, 1980, now abandoned.

BACKGROUND OF THE INVENTION

This invention relates to an insulated-gate field-effect transistor in which interdigitated source and drain fingers of one conductivity type are provided in part of an epitaxial layer of the opposite conductivity type on a more highly conductive substrate, the source fingers are short-circuited to the substrate, a gate on an insulating layer on the epitaxial layer is provided between the source and drain fingers, and a drain electrode which is interdigitated with the gate is provided to contact said drain fingers.

The invention further relates to a method of manufacturing this transistor.

In a paper entitled "Si UHF MOS High-power FET" on pages 733 and 734 of IEEE Transactions on Electron Devices, November 1974, there is disclosed a method of manufacturing an insulated-gate field-effect transistor for high frequency and high power operation. In this method interdigitated source and drain fingers of one conductivity type are provided in part of an epitaxial layer of the opposite conductivity type on a more highly conductive substrate; the source fingers are short-circuited to the substrate; a gate on an insulating layer on the epitaxial layer is provided between the source and drain fingers, and a drain electrode which is interdigitated with the gate is provided to contact said drain fingers. An advantage of such a transistor is that the source electrode can be provided by a connection to the back face of the substrate, for example on a copper heat sink. This permits the interdigitation off the gate and drain electrode to be uncomplicated by the source electrode, and is especially useful when the transistor is incorporated in the circuit in a common-source configuration.

However, the known method described in the IEEE Transactions paper has several disadvantages. The source-fingers are short-circuited to the substrate by a deep diffusion of highly-doped "pipes" which are of the same conductivity type as both the substrate (p+) and the p-type epitaxial layer. These p+ pipes are driven completely through the p-type epitaxial layer to contact the substrate. The interdigitated source and drain fingers (n+) are then provided by diffusion so that the source fingers overdope edge parts of the p+-types at the surface of the epitaxial layer. Subsequently an aluminum electrode pattern is formed comprising the interdigitated gate and drain electrodes as well as electrodes which short-circuit the n+ source fingers to the p+ pipes at the surface of the epitaxial layer.

Because the p+ pipes must be locally overdoped at the surface of the epitaxial layer by the n+ source fingers, the surface-doping concentration of the p+ pipes is restricted, and so the diffused doping concentration of the pipes where they approach the substrate is even smaller. This restriction on the doping concentration of the p+ pipes can cause significant series resistance for the source connection and so can result in significant negative feedback and reduced gain for the transistor when used in a grounded source configuration.

Because the acceptor dopant forming the p+ pipes diffuses laterally while being driven through the epitaxial layer, the resulting pipes can be wide and occupy a large surface area within the interdigitated geometry, particularly with thick epitaxial layers.

The aluminum electrode pattern is provided after the source and drain diffusion, and this is necessary to short-circuit the source fingers to the p+ pipes. It results in an aluminum gate, whereas for some applications a polycrystalline silicon gate may be desirable. It also results in the need for an alignment step between, on the one hand, a photo-mask used to define the electrode pattern and, on the other hand, the channel defined by the previously-provided n-type source and drain fingers. However, for good high frequency performance it is desirable to minimize the overlap capacitance of the gate with the source and drain fingers. Thus, it is desirable to use a self-aligned process in which the gate masks the channel area during the source and drain doping step. Modification of the method described in the IEEE Transactions paper so as to use a self-aligned process is hampered by the additional need which that method imposes of masking the source doping over the p+ pipes so as to terminate at the surface of the epitaxial layer the p-n junctions which are to be short-circuited.

SUMMARY OF THE INVENTION

Applicants have found that it is often desirable for the gate to consist not merely of an interdigitated finger structure but to extend completely around the interdigitated transistor drain and so to extend also completely around the intermediate source fingers (both at their ends as well as along their sides). This is desirable so as to prevent the source and drain being interconnected by parasitic channels not under the control of the gate, and also to prevent parasitic channels forming connections between the active transistor area and the edge of the semiconductor body which tends to be electrically unstable.

According to the present invention, an insulated-gate field-effect transistor in which interdigitated source and drain fingers of one conductivity type are provided in part of an epitaxial layer of the opposite conductivity type on a more highly conductive substrate, the source fingers are short-circuited to the substrate, a gate on an insulating layer on the epitaxial layer is provided between the source and drain fingers, and a drain electrode which is interdigitated with the gate is provided to contact said drain fingers is characterized in that the gate comprises a gate layer having a plurality of separate, mutually parallel apertures which overlie areas where separate parallel parts of the source fingers are provided, mutually parallel grooves in the epitaxial layer being present within the apertures, which grooves extend through the epitaxial layer to said substrate, have a V-shaped cross-section, and are adjoined along opposite sides by said parts of the source fingers, there being present within said apertures of the gate layer and over the walls of said grooves parallel metal fingers which extend longitudinally along said source fingers to short-circuit the said parts of said source fingers to the epitaxial layer and to the substrate.

Such an insulated-gate field-effect transistor may be advantageously, simply and economically manufactured by a method providing a high degree of self-alignment.

Therefore, according to the present invention a method of manufacturing an insulated-gate field-effect transistor in which interdigitated source and drain fingers of one conductivity type are provided in part of an epitaxial layer of the opposite conductivity type on a more highly conductive substrate, the source fingers are short-circuited to the substrate, a gate on an insulating layer on the epitaxial layer is provided between the source and drain fingers, and a drain electrode which is interdigitated with the gate is provided to contact said drain fingers, is characterized by the steps of:

(a) forming on said insulating layer a gate layer having a plurality of separate, mutually parallel apertures, (b) introducing dopant determining said one conductivity type into said epitaxial layer via said apertures so as to form mutually parallel islands of said one conductivity type from which at least part of the source fingers is to be provided.

(c) providing on the epitaxial layer an etch-resistant mask having mutually parallel apertures each of which overlies an area of an island and is smaller than the gate layer aperture associated with the island, (d) etching away said areas of said islands and underlying parts of the epitaxial layer so as to form mutually parallel grooves which extend through the epitaxial layer to said substrate, having a V-shaped cross-section, extend longitudinally along said islands and are adjoined along opposite sides by remaining parts of said islands, and (e) providing within said apertures of the gate layer and over the walls of said grooves parallel metal fingers which extend longitudinally along said islands to short-circuit the remaining parts of said islands to the epitaxial layer and to the substrate, which remaining parts form said source fingers of the transistor.

Such a method features several advantages which are desirable for interdigitated transistor structures, especially for high frequency operation.

The source fingers of the transistor are short-circuited to the substrate by the metal fingers provided in the V-shaped grooves in step (e). These metal fingers can thus form a very low resistance path to the substrate so that the series resistance for a source connection via the substrate can be significantly lower than when using a deep diffusion through the epitaxial layer. In order to reduce this series resistance as much as possible it is preferable for the grooves and the short-circuiting fingers to extend along as much as possible of the length of the source islands, for example along substantially the whole of said length.

Because the grooves formed in step (d) have a V-shaped cross-section they need not occupy a large surface area of the epitaxial layer so that a compact interdigitated geometry can be obtained for the active area of the transistor. Such grooves can be readily formed in monocrystalline semiconductor material by appropriately choosing the crystal plane orientation of the major surface of the substrate and by using an anisotropic etchant.

The grooves formed in step (d) are etched through part of the islands from which at least part of the source fingers are to be provided. Thus the short-circuit is effected without providing a mask other than the gate layer for the definition of these source islands in the dopant introduction step (b). Thus step (b) involves a simple self-alignment of the source islands with the apertured gate layer; this can result in a very low source to gate capacitance, and therefore a very low input capacitance for the transistor when used in a common source circuit configuration. The gate layer may be of polycrystalline silicon and may be doped at least during step (b).

Because the source islands are formed in step (b) by dopant introduction via separate, mutually parallel apertures in the gate layer, the portions of this layer around these apertures can form a gate structure which extends completely around the source fingers to prevent the source and drain being interconnected by parasitic channels not under the control of the gate.

Preferably, the drain fingers are also formed in one or more dopant introduction steps so as to be self-aligned with the apertured gate layer. Thus, the gate layer formed in step (a) may comprise a base portion with elongate portions extending therefrom in the form of closed loops around those apertures via which in step (b) the islands associated with the source fingers are formed, and adjacent closed loops may be spaced from each other along the base portion by areas in which at least one dopant introduction is effected to provide the drain fingers in parts of the epitaxial layer between adjacent islands.

Preferably, the transistor gate extends completely around the interdigitated drain fingers in the active transistor area. This structure can be obtained in a simple manner when the gate layer formed in step (a) comprises two base portions connected together at their ends to define in the gate layer a large aperture within which the closed-loop portions from one base portion extend towards those from the other base portion. In this case, a thicker insulating layer than that below the gate layer may be locally present inside the said large aperture, and the area over which dopant is introduced to form the drain fingers may be defined by both the edge of said thicker insulating layer and the edge of said gate layer. A bonding pad area of the drain electrode can be provided on this thicker insulating layer, and because this insulating layer has masked any extension of the drain doping under this area the voltage-dependant capacitance between the drain and the epitaxial layer is reduced.

Part of each drain finger may be formed in one dopant introduction step while masking an area adjacent the edge of the gate layer, after which ion implantation of dopant determining said one conductivity type may be effected at least through this area to form a higher resistivity part of each drain finger adjacent the transistor channel. Such a higher resistivity part is self-aligned with the edge of the gate layer and can serve to increase significantly the drain breakdown voltage. If desired these processing steps may also be effected simultaneously for the provision of the source islands to form a higher resistivity part of each source finger adjacent the transistor channel.

The interdigitated source and drain fingers are formed within an active device area the boundary of which is preferably defined by an aperture in a field insulating layer provided at the surface of the epitaxial layer. At least one source finger of the transistor may be provided by an island of the said one conductivity type which is formed in step (b) by dopant introduction into an area between an inner edge of the field-insulating layer and an outer edge of the gate layer within the aperture in the field-insulating layer, and this island also may be provided with a groove and a metal finger in steps (d) and (e) respectively. The provision of at least one extra source finger increases the source area of the transistor; any parasitic channel formed between the edge of the body and this source finger (which is beyond the outer edge of the gate layer) is not a disadvantage as compared with a parasitic channel involving the drain, because the source fingers are short-circuited to the epitaxial layer.

The interdigitated source and drain fingers of said one conductivity type may be of simple geometry, each finger having substantially straight opposite sides; such fingers can be formed through gate-layer apertures having substantially straight opposite sides. However, it can be advantageous to use a more complex geometry where, for example, each source and drain finger comprises interdigitated sub-fingers. Thus, the gate-layer apertures associated with the source islands may have castellated opposite sides so that each of the resulting source fingers has mutually parallel sub-fingers extending transversely therefrom. An example of such a complex geometry will be described hereinafter.

BRIEF DESCRIPTION OF THE DRAWING

Embodiments of the invention will now be described, by way of example, with reference to the accompanying diagrammatic drawings, in which FIGS. 1 to 10 illustrate in sequence semiconductor body portions of an insulated-gate field-effect transistor at successive stages in its manufacture by a method in accordance with the invention, and FIGS. 11 and 12 illustrate two stages in a modification of the method of FIGS. 1 to 10 also in accordance with the invention.

In these drawings:

It should be noted that the Figures are not drawn to scale, and the relative dimensions and proportions of some parts of these Figures have been shown exaggerated or reduced for the sake of clarity and convenience. The same or similar parts of both the embodiments of FIGS. 1 to 10 and FIGS. 11 and 12 are referred to by the same reference numerals.

DETAILED DESCRIPTION

Figure 1:
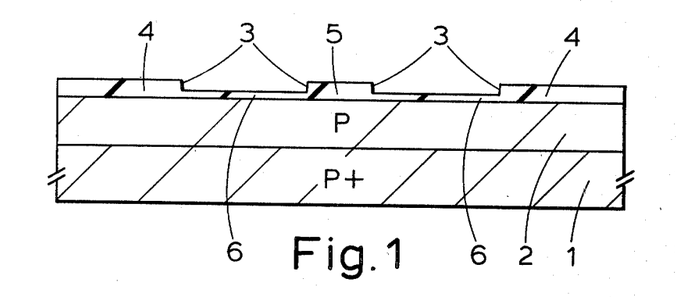
FIG. 1 is a cross-section on the line I—I of FIG. 2.

The starting material for the embodiment of FIGS. 1 to 10 is a highly-doped p-type monocrystalline silicon substrate 1 which is designated p+ in FIG. 1 and may have a resistivity of, for example, 0.01 ohm.cm. The major surfaces of the p+ substrate 1 are (100) crystal planes. On one major surface a less-highly doped p-type silicon epitaxial layer 2 is provided. The layer 2 may have a thickness of, for example, 10 microns and a resistivity of, for example, 30 ohm-cm which corresponds to an acceptor doping of about $10^{14}$ dopant atoms/cm$^3$.

Figure 2:
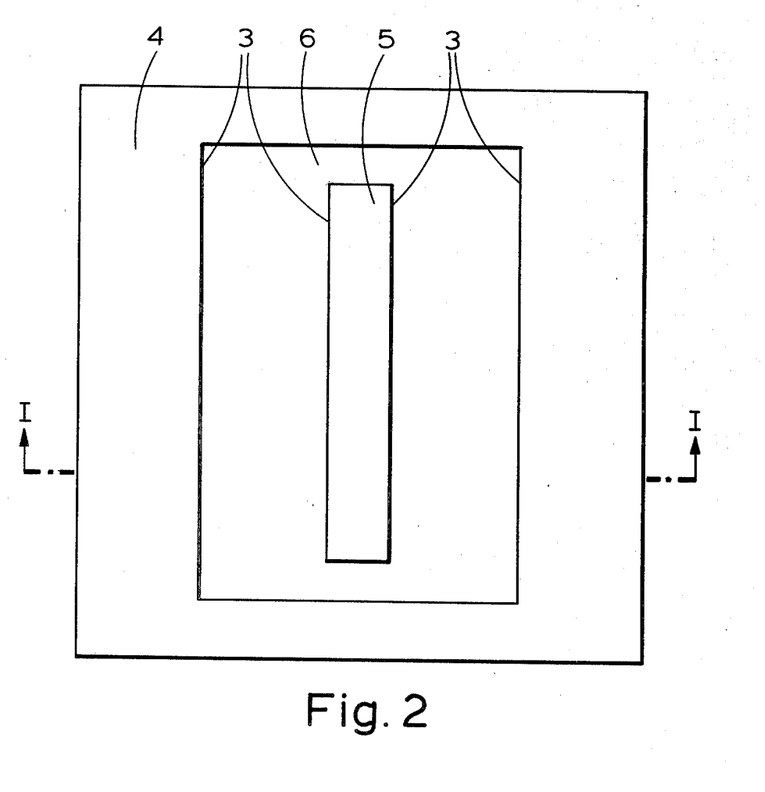
FIGS. 2 and 3 are plan views (at two early stages in its manufacture) of the whole of a semiconductor body portion in which the transistor is to be formed.

The outer edge of the semiconductor body portion shown in FIGS. 1 and 2 corresponds to that of the final transistor body. However as known in the semiconductor art, it is desirable to fabricate a plurality of the same devices simultaneously in a common semiconductor wafer which is divided at a later stage of manufacture into the separate bodies of each device. Therefore it should be understood that in practice the body of FIGS. 1 and 2 is only part of a larger wafer formed by the substrate 1 and epitaxial layer 2 which will have lateral dimensions sufficient for the fabrication therein of a large number of transistors side-by-side, and that the various processing steps to be described hereinafter are effected simultaneously at a large number of locations on the wafer to simultaneously fabricate each transistor.

An insulating layer 4,5 is next provided at the surface of the epitaxial layer 2, for example by thermal oxidation. An annular aperture 3 is then formed in the insulating layer using known photolithographic and etching techniques to leave an outer portion 4 and an inner portion 5. The portion 4 is to act as the field insulating layer of the transistor and its inner edge defines the boundary of the active device area within which interdigitated source and drain fingers of the transistor are to be formed. The insulating layer portions 4 and 5 may be, for example, about one micron thick. The layer portions 4 and 5 may alternatively be formed by localized oxidation of the silicon layer 2 using an annular silicon nitride layer as a mask over the aperture area 3.

A thin insulating layer 6 which is to underlie the transistor gate is then grown on the exposed epitaxial layer surface in the annular aperture 3 of the thicker insulating layer 4, 5. The layer 6 may be, for example, 0.1 micron thick and formed by thermal oxidation. The resulting structure is shown in FIGS. 1 and 2. If it is desired to adjust the transistor threshold voltage as described in British Patent (GB) 1,261,723, dopant implantation may now be effected into the epitaxial layer surface through the layer 6 in the annular aperture 3. The threshold voltage is also determined by the material of the transistor gate, and in this embodiment polycrystalline silicon is used.

Figure 3:
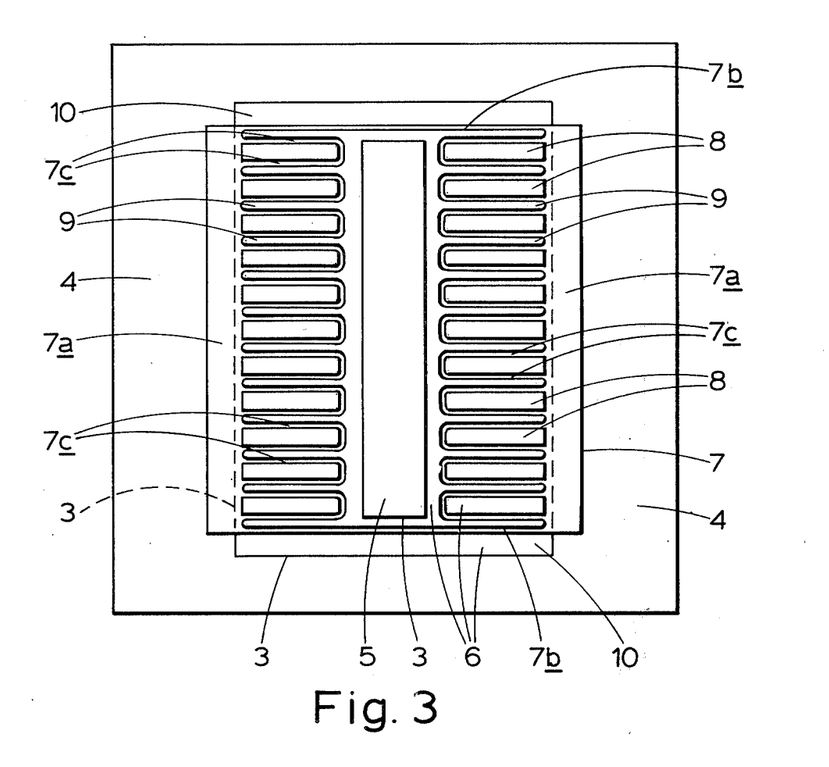

Polycrystalline silicon is deposited in known manner over the insulating layers 4, 5, 6 and is patterned using known photolithographic and etching techniques to form an apertured gate layer 7 which is shown in FIG. 3. The gate layer 7 comprises two base portions 7a from which elongate portions 7b and 7c extend to form the active gate of the transistor. These portions 7b and 7c are present between where interdigitated source and drain fingers of the transistor are to be formed in the epitaxial layer 2.

The portions 7a are connected together at their ends by the two portions 7b to form a large aperture within which the insulating layer portion 5 is present and within which the portions 7c from one base portion 7a extend towards the portions 7c from the other base portion 7a. The portions 7c extend from the base portions 7a in the form of closed loops around a plurality of separate, mutually parallel apertures 8. The longitudinal edges of the apertures 8 are aligned along (110) planes of the epitaxial layer 2. Via these apertures 8, islands associated with the source fingers are to be formed. Adjacent closed loops 7c are spaced from each other along the portions 7a by areas 9 where the drain fingers are to be formed. Extra source fingers are to be formed in gaps 10 between the inner edge of the field insulating layer 4 and the outer edge of the gate portions 7b within the aperture 3 in the layer 4.

Figure 4:
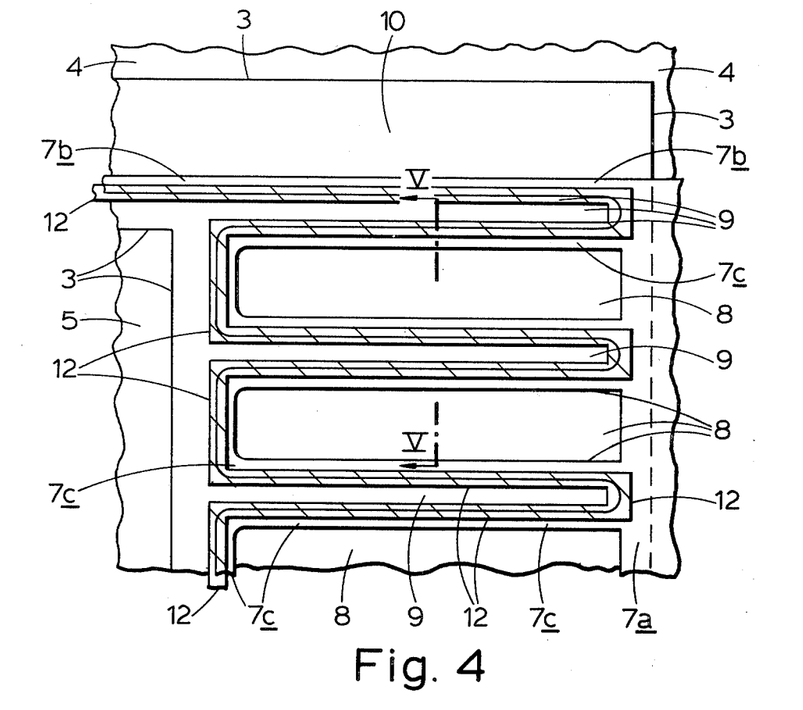
FIGS. 4, 8 and 10 are plan views (at later stages) of the upper right-hand corner of the active transistor area of FIGS. 2 and 3.

A photo-resist mask 12 is now provided over the edge of the gate portions 7a, 7b and 7c adjacent where the transistor drain is to be formed so as to mask the part of the thin insulating layer 6 adjacent this edge. Then while using the photo-resist mask 12 and the gate layer 7 to mask the underlying portions of the layer 6, the unmasked portions of the layer 6 are removed by etching to form source and drain windows which locally expose the epitaxial layer surface for subsequent doping. The thick insulating layer 4 is thinned slightly but not removed in this etching treatment. If desired, such thinning of the layer 4 can be avoided by also providing the photo-resist mask 12 over this layer 4. The source windows correspond substantially in area to the apertures 8 and the gaps 10. There is only one drain window which is defined by the edge of the thick insulating layer portion 5 and the edge of the part of the insulating layer 6 remaining below the photo-resist mask 12. Thus, this drain window includes only part of the areas 9 between the closed loops 7c of the gate layer 7. The resulting structure is shown in FIG. 4.

Figure 5:
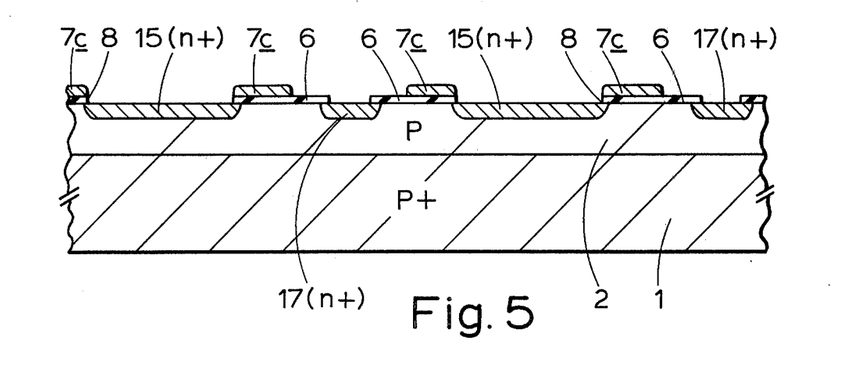
FIGS. 5, 6, 7 and 9 are cross-sections (at later stages) of the body portion indicated by line V—V in FIG. 4, and FIGS. 11 and 12 are plan views of part of the active area of another transistor during manufacture.

Donor dopant, for example phosphorus or arsenic, is now introduced through these source and drain windows into the p-type epitaxial layer 2, for example to a depth of about one micron. This dopant introduction may be effected by thermal diffusion after removing the photo-resist mask 12. The same doping step also dopes the gate layer 7, thus lowering its resistivity. Part of the resulting structure is illustrated in FIG. 5.

The donor dopant introduced into the layer 2 through the source windows at the apertures 8 forms mutually parallel highly-doped n-type islands 15 (n+) from which the source fingers are to be provided. The donor dopant introduced into the layer 2 through the other two source windows which are at the gaps 10 also forms two parallel highly-doped n-type islands 16 (n+) from which two extra source fingers are to be provided, see FIG. 8. Therefore this doping process involves a simple self-alignment of the source islands 15 and 16 with the apertured gate layer 7. There is only a small overlap of the islands 15 and 16 with the layer 7 which results from the lateral diffusion of the dopant. Thus, the source to gate capacitance of the manufactured transistor can be low.

The donor dopant introduced into the layer 2 through the drain window forms a highly-doped n-type drain contact region 17 (n+). This region 17 includes a part of each of the drain fingers which is interdigitated with the source islands 15 and 16. The doping process similarly involves self-alignment of the drain contact region 17 with the outer edge of the insulating layer portion 5 and with the edge of the insulating layer portion 6 which had been defined by the photo-resist mask 12 and which masks against this doping process an area adjacent the edge of the gate layer 7.

Figure 6:
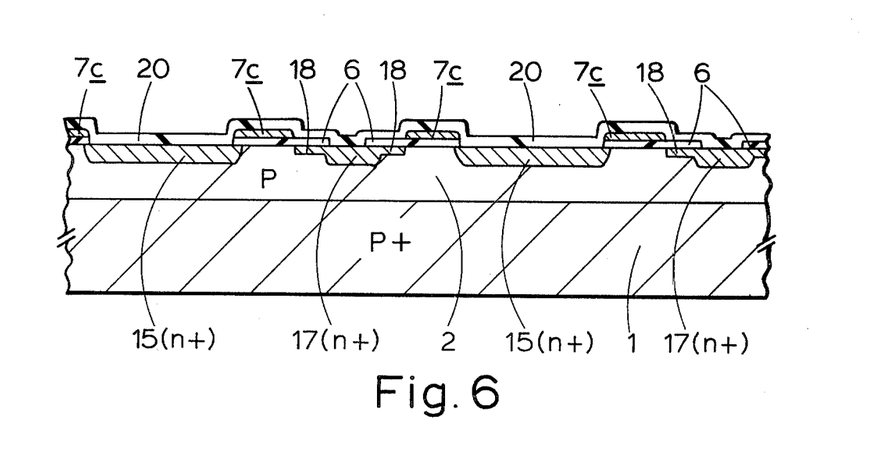

A further donor dopant introduction step is now effected into the layer 2 over an area which is defined by the edges of both the thick insulating layers 4 and 5, and by the edges of the gate layer 7 within the aperture 3. This may be effected by implantation of phosphorus or arsenic ions. This dopant is also implanted in the gate layer 7, the source islands 15 and 16 and the drain contact region 17, but its primary function is to form higher resistivity parts 18 of each drain finger. Therefore a low ion dose is used, for example $10^{12}$ dopant ions/cm$^2$, so as to produce a low doping concentration. This higher resistivity part 18 is the part of each drain finger which adjoins the transistor channel and is aligned with the edge of the gate layer 7. The part 18 is formed by implantation through the part of the insulating layer 6 not masked by the gate layer 7. The thick insulating layers 4 and 5 also act as implantation masks. The part 18 forms together with the contact region 17 the whole of the n-type drain fingers of the transistor. As shown in FIG. 6 these drain fingers 17, 18 are located in the parts of the epitaxial layer 2 between adjacent source islands 15, 16. The part 18 may be, for example 4 microns wide and 0.4 micron deep.

After annealing the doner implant in known manner, an insulating layer 20 of, for example, silicon dioxide is deposited to cover the whole of the top surface of the wafer. The resulting structure is illustrated in FIG. 6. The layer 20 may be, for example, about 0.4 micron thick.

By using known photolithographic and etching techniques, areas of the insulating layer 20 are now removed to form therein mutually parallel apertures 22 each of which overlies a nonperipheral area of a source island 15 or 16. The edges of the apertures 22 are aligned with (110) planes of the epitaxial layer 2. Each of the apertures 22 overlying an island 15 is smaller than the associated aperture 8 of the gate layer 7 and is wholly contained within this aperture 8. Similarly, the apertures 22 overlaying the two islands 16 are smaller than and wholly contained within the associated gaps 10.

Then, while using the remaining insulating layer 20 as an etch-resistant mask, the areas of the n-type islands 15 and 16 exposed at the apertures 22 are subjected to an anisotropic etching treatment using, for example, an aqueous potassium hydroxide solution which has a fast etch rate on (100) silicon planes but a very slow etch rate on (111) planes.

Figure 7:
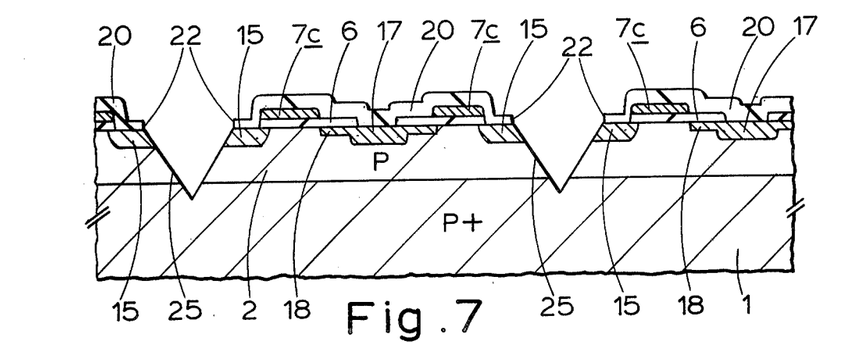
Figure 8:
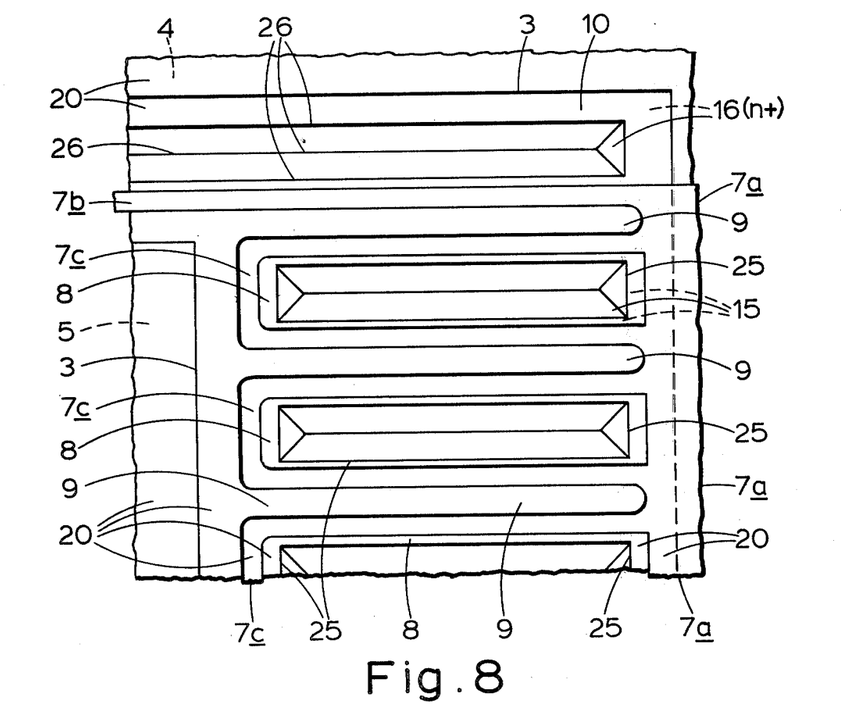

Because of this differential etch rate, the exposed areas of the islands 15 and 16 and underlying parts of the epitaxial layer are etched away to form mutually parallel grooves 25 and 26, respectively, which have a V-shaped cross-section (as illustrated in FIG. 7) and extend along substantially the whole length of the islands 15 and 16, respectively (as illustrated in FIG. 8).

The side walls of the grooves at islands 15 and 16 are (111) crystal planes. Because of the very slow etch rate of these planes, these side walls meet at a depth which is related to and determined by the width of the apertures 22 and there is very little lateral etching under the layer 20 beyond the edge of the aperture 22. The dimensions of the apertures 22 are chosen such that the grooves 25 and 26 extend through the epitaxial layer 2 to the substrate 1 and are adjoined along their opposite sides and at their opposite ends by remaining parts of the islands 15 and 16 which now constitute the source fingers of the transistor.

For the sake of clarity, the areas of the substrate 1, epitaxial layer 2 and source fingers 15 and 16 which are exposed within the grooves 25 and 26 are not illustrated in the plan view of FIG. 8. They are shown in the cross-section of FIG. 7.

Although not shown in the plan view of FIG. 8, the insulating layer 20 overlies the whole layer structure on the epitaxial layer 2 except at the grooves 25 and 26. Windows for contacting the source fingers 15 and 16, drain contact region 17 and gate layer 7 are now formed in the layer 20 using known photolithographic and etching techniques.

Figure 9:
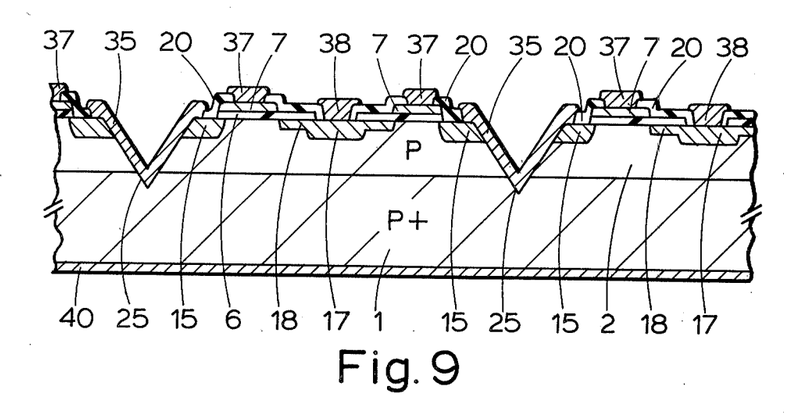
Figure 10:
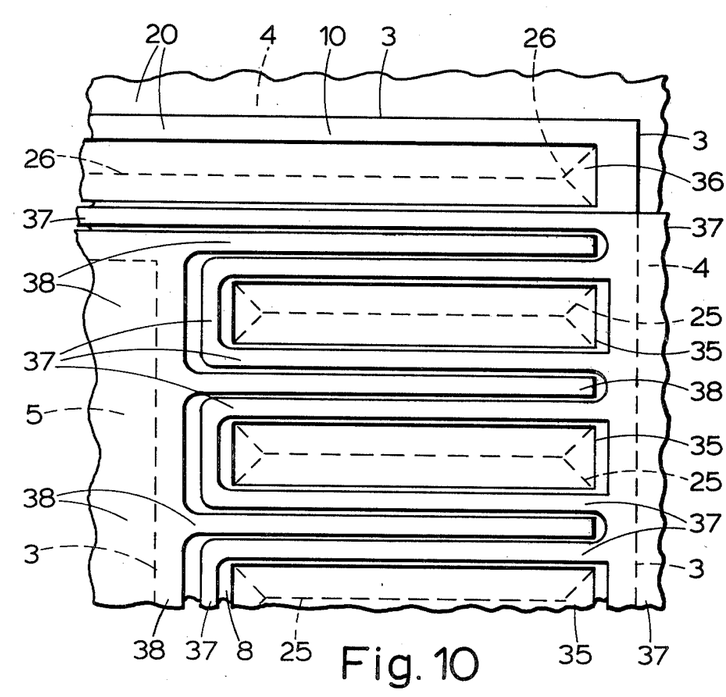

Aluminum is then deposited to form a layer which may be, for example one micron thick. This aluminum layer is then patterned using known photolithographic and etching techniques to form separate metal electrodes 35, 36, 37 and 38. The resulting structure is illustrated in FIGS. 9 and 10.

There is only one metal electrode 37 which contacts the gate layer 7. Electrode 37 has substantially the same shape as the polycrystalline gate layer 7, except that it has a larger area over the field insulating layer 4 to act as a bonding pad for the gate.

There is also only one metal electrode 38 which contacts the drain region 17. Electrode 38 has a main base portion over the insulating layer 5 and finger portions which extend from the base portion so as to be interdigitated with the elongate portions of the gate layer 7 and its metal electrode 37. The base portion of electrode 38 acts as a bonding pad for the drain electrode.

There are a plurality of electrodes 35 and two electrodes 36, all of which are in the form of parallel but separate metal fingers. The electrodes 35 are present within the apertures 8 of the gate layer 7 and extend over the walls of the grooves 25 so as to short-circuit the n-type source fingers 15 to the p-type epitaxial layer 2 and substrate 1 along substantially the whole length of the fingers 15. Similarly, the electrodes 36 are present within the gap 10 and extend over the walls of the grooves 26 so as to short-circuit the n-type fingers 16 to the p-type epitaxial layer 2 and substrate 1 along substantially the whole length of the fingers 16. As shown in FIG. 9, a further metal electrode 40 is provided in known manner over the back face of the substrate 1 to form the source connection for the transistor.

Such a transistor has its gate 7 extending completely around the drain and completely around the source fingers 15 between its drain fingers 17, 18. This prevents parasitic channels not under the control of the gate 7 from interconnecting the source and drain and/or connecting the drain to the edge of the semiconductor body. Furthermore, its source and drain fingers 15 to 18 have been formed using the gate layer 7 in a self-aligned process so minimizing overlap capacitance, and the metal electrodes 35 and 36 in the V-shaped grooves 25 and 26 provide a very low resistance path from the source fingers 15 and 16 to the source connection 40 without wasting space in the interdigitated active area of the transistor. Such a transistor is well suited for high frequency, high power operation, particularly although not exclusively in a circuit in a common-source configuration.

Applicants have fabricated such a transistor in which there were 24 n-type drain fingers each having a length of 150 microns, the channel length (between adjacent n-type source and drain fingers) was 5 microns, the width of the high resistivity drain part 18 (between the channel and region 17) was 4 microns and its depth was 0.4 micron, the width and depth of the fingers of the drain region 17 were 4 microns and one micron respectively, the width of the whole meandering channel was 7 mm., the width of the grooves 25 and 26 was 18 microns, and the width of the source fingers 15 and 16 remaining on opposite sides of the grooves 25 and 26 was about 6 microns. This single cell device produced an output power ($P_{out}$) of 4 Watts from an input power ($P_{in}$) of 0.6 Watts at a frequency of 1 GHz with a drain-source voltage ($V_{ds}$) of 28 Volts. By comparison the multi-cell device described in said IEEE Transactions paper had the following performance at 1 GHz:

$P_{out}$ = 4.4 Watts
$P_{in}$ = 1 Watt, and
$V_{ds}$ = 36 Volts.

Figure 11:
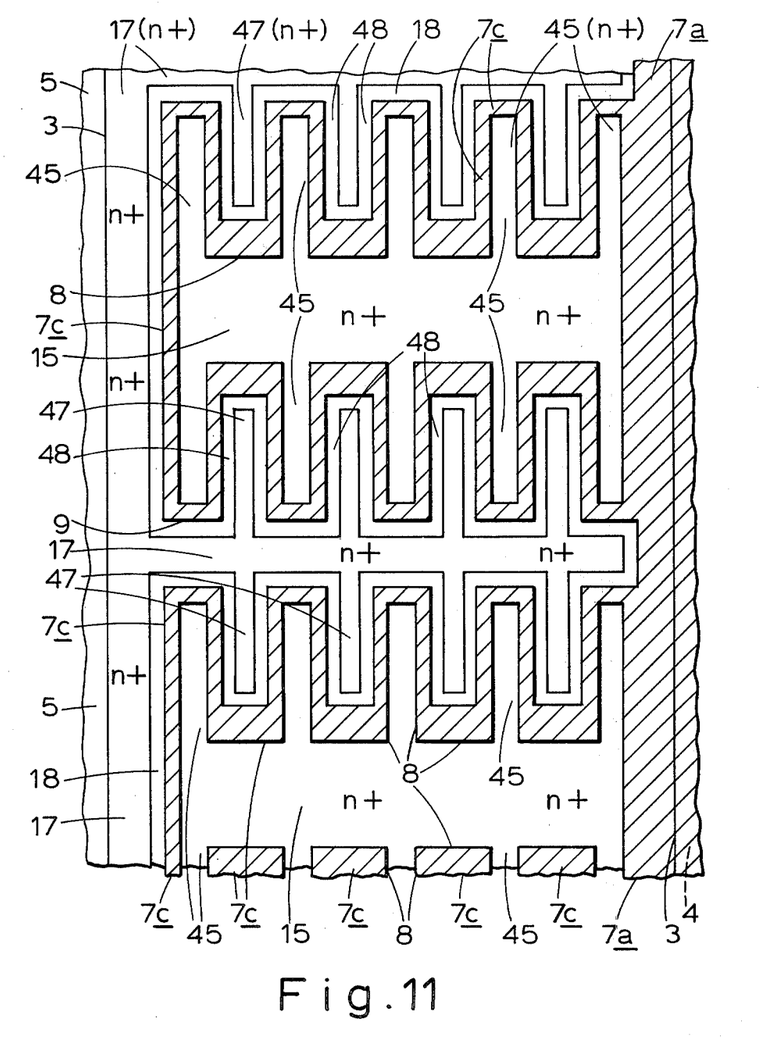

In the embodiment of FIGS. 1 to 10, the source fingers 15 and drain fingers 17, 18 were straight-sided and formed through straight-sided apertures 8 and 9 in the gate layer 7. FIG. 11 shows a modification in which the gate-layer apertures 8 and 9 have castellated opposite sides so as to form therebetween meandering gate loops 7c extending from the base portions 7a of the gate layer 7. For the sake of clarity in the drawing the gate layer 7 is hatched in FIG. 11, but it is only shown in broken outline in FIG. 12.

FIG. 11 illustrates the structure formed after the source and drain doping steps. The resulting n+ islands 15 from which the source fingers are formed each have mutually parallel sub-fingers 45 extending transversely therefrom. Similarly, the resulting drain fingers 17, 18 have mutually parallel sub-fingers 47, 48 extending transversely therefrom. These sub-fingers 45 and 47, 48 are themselves interdigitated as well as the main fingers 15 and 17, 18.

Figure 12:
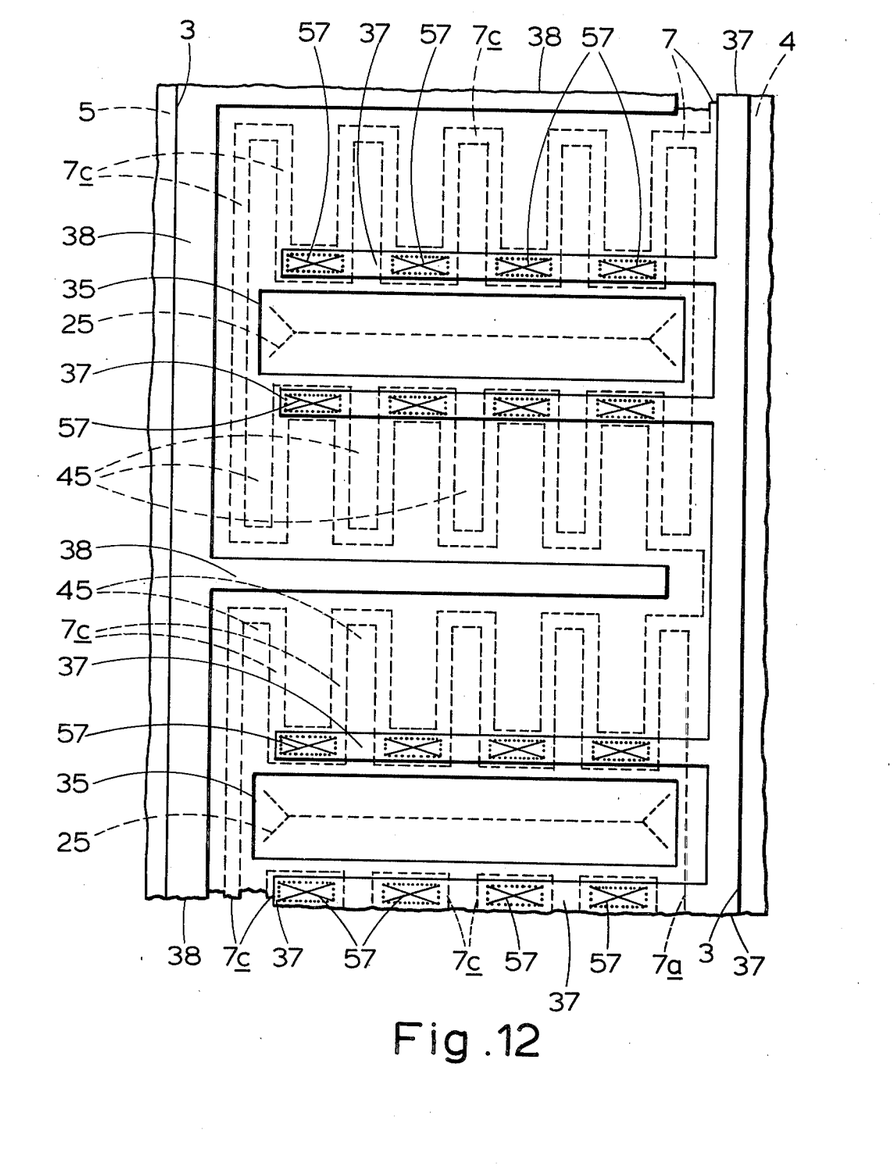

In this modification the gate electrode 37 which contacts the gate layer 7 does not have substantially the same shape as the layer 7. FIG. 12 illustrates the structure formed after patterning an aluminum layer to define the separate electrodes 35, 36, 37 and 38. As illustrated in FIG. 12, instead of meandering loops, the electrode 37 comprises straight nonlooped fingers which contact the meandering gate loops at discrete contact windows 57. It should be noted that for the sake of clarity the edges of the source and drain contact windows are not shown in FIG. 12. The windows 57 are shown in dotted outline in FIG. 12 and expose for contacting slightly expanded areas of the meandering gate loops 7c adjacent the main part of the source fingers 15. The source sub-fingers 45 extend below these straight fingers of the electrode 37 and are insulated therefrom by the insulating layer 20 (not shown in FIG. 12). This more complex geometry permits the contacting of narrow gate loops 7c so that the transistor may have a short channel between its source fingers 15 and drain fingers 17, 18.

It will be evident that many other modifications are possible within the scope of this invention. Thus, for example, it is not necessary for the grooves 25 and 26 and the short-circuit effected by the metal fingers 35 and 36 to extend along substantially the whole of the length of the source fingers 15 and 16, respectively. Because of the high conductivity of the direct metal connection 35, 36, a sufficiently low source series resistance will still be achieved for many purposes if the groove and short-circuit extend along at least half of this length, for example by dividing the groove 25 or 26 in each source finger 15 or 16 into separate grooves extending along separate lengths of the source fingers 15 or 16.

In FIG. 4, the masking of the area of the thin insulating layer 6 below which the high resistivity drain part 18 is to be formed is effected by first forming the final gate layer structure 7 and then covering some of its edges with a mask 12. As an alternative, the gate layer 7 may originally be formed with wider portions 7b and 7c which also extend over the area of the layer 6 below which the part 18 is to be formed. These wider portions 7b and 7c may then be used to define the area for the first dopant introduction (for example by defining diffusion windows etched in the layer 6), after which part of the portions 7b and 7c is removed (possibly in a self-aligned manner, for example by underetching) to form an area of the layer 6 which is not masked by the final gate layer structure against the subsequent dopant introduction used to form the drain part 18.

If so desired, high resistivity parts of the source fingers 15 and 16 may be formed adjacent the transistor channel simultaneously with the drain parts 18 using the same processing steps. But in general this will not be preferred as it will increase the source series resistance.

Opposite conductivity type transistors can be formed by reversing the conductivity types of all the portions of the device structure.

Although in the embodiments so far described the epitaxial layer has been of the same conductivity type as the substrate, transistors in accordance with the invention can also be formed with the more highly conductive substrate of the same conductivity type as the source and drain fingers, and hence of opposite conductivity type to the epitaxial layer. Such an opposite conductivity type substrate may be used in fabricating for example both p-channel and n-channel transistors in the same integrated device, one of the transistors being formed in an island of opposite conductivity type in the epitaxial layer.

In addition to manufacturing transistors in accordance with the invention for R-F power amplification, such transistors may also be manufactured for high speed switching applications, for example to achieve switching times of less than 2 nanoseconds.

What is claimed is:

1. A method of manufacturing an insulated-gate field-effect transistor in which interdigitated source and drain fingers of one conductivity type are provided in part of an epitaxial layer of the opposite conductivity type on a more highly conductive substrate, the source fingers are short-circuited to the substrate, a gate on an insulating layer on the epitaxial layer is provided between the source and drain fingers, and a drain electrode which is interdigitated with the gate is provided to contact said drain fingers, comprising the steps of:
    (a) forming on said insulating layer a gate layer having a plurality of separate, mutually parallel apertures; then
    (b) introducing dopant determining said one conductivity type into said epitaxial layer via said apertures to form mutually parallel islands of said one conductivity type from which at least a portion of the source fingers is to be provided; then
    (c) providing on the epitaxial layer an etch-resistant mask having mutually-parallel apertures, each of which overlies an area of an island and is smaller than the gate layer aperture associated with the island; then
    (d) etching away said areas of said islands and underlying parts of the epitaxial layer to form mutually parallel grooves which extend through the epitaxial layer to said substrate, have a V-shaped cross-section, extend longitudinally along said islands and are adjoined along opposite sides by remaining parts of said islands; and then
    (e) providing within said apertures of the gate layer and over the walls of said grooves parallel metal fingers which extend longitudinally along said islands to short-circuit the remaining parts of said islands to the epitaxial layer and to the substrate, said remaining parts forming said source fingers of the transistor.

2. A method according to claim 1, wherein the gate layer formed in step (a) comprises a base portion with elongate portions extending therefrom in the form of closed loops around those apertures via which in step (b) the islands associated with the source fingers are formed, and adjacent closed-loops are spaced from each other along the base portion by areas in which at least one dopant introduction is effected to provide the drain fingers in parts of the epitaxial layer between adjacent islands.

3. A method according to claim 2, wherein the gate layer comprises two base portions connected together at their ends to define in the gate layer a large aperture within which the closed-loop portions from one base portion extend towards those from the other base portion.

4. A method according to claim 3, wherein a thicker insulating layer than that below the gate layer is locally present inside said large aperture, and the area over which dopant is introduced to form the drain fingers is defined by both the edge of said thicker insulating layer and the edge of said gate layer.

5. A method according to claim 1, wherein part of each drain finger is formed in one dopant introduction step while masking an area adjacent the edge of the gate layer, after which ion implantation of dopant determining said one conductivity type is effected at least through this area to form a higher resistivity part of each drain finger adjacent the transistor channel.

6. A method according to claim 1, wherein the interdigitated source and drain fingers are formed within an active device area the boundary of which is defined by an aperture in a field insulating layer provided at the surface of the epitaxial layer, at least one source finger is provided by an island of said one conductivity type which is formed in step (b) by dopant introduction into an area between an inner edge of the field insulating layer and an outer edge of the gate layer within the aperture in the field-insulating layer, and this island is provided with a groove and a metal finger in steps (d) and (e), respectively.

7. A method according to claim 1, wherein the gate layer apertures associated with the source islands have castellated opposite sides so that each of the resulting source fingers has mutually parallel sub-fingers extending transversely therefrom.

8. A method according to claim 1, wherein the gate layer is of polycrystalline silicon and is doped at least during step (b).

* * * * *